United States Patent
Takayama et al.

(10) Patent No.: US 6,272,312 B1
(45) Date of Patent: Aug. 7, 2001

(54) SATELLITE BROADCASTING RECEIVING TUNER WHICH INHIBITS INTERFERENCE CAUSED BY SATELLITE BROADCAST SIGNALS HAVING ONE OCTAVE HIGHER FREQUENCY BAND

(75) Inventors: Akira Takayama; Minobu Okada, both of Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 09/227,759

(22) Filed: Jan. 8, 1999

(30) Foreign Application Priority Data

Jan. 12, 1998 (JP) .................................................. 10-003902

(51) Int. Cl.$^7$ ...................................................... H04B 1/16
(52) U.S. Cl. ...................... 455/3.02; 455/319; 455/310; 725/70
(58) Field of Search ............................. 455/324, 3.2, 255, 455/258, 316, 317, 318, 319, 320, 3.02, 310; 725/68, 70

(56) References Cited

U.S. PATENT DOCUMENTS

| | | | |
|---|---|---|---|
| 4,817,167 | * 3/1989 | Gassmann | 455/324 |
| 5,008,956 | * 4/1991 | Hemmie | 455/319 |
| 5,787,126 | * 7/1998 | Itoh et al. | 375/340 |
| 5,918,167 | * 6/1999 | Tiller et al. | 455/324 |
| 6,091,931 | * 7/2000 | Ben-Efraim et al. | 455/3.02 |

FOREIGN PATENT DOCUMENTS

| | | |
|---|---|---|
| 0 305 604 A1 | 3/1989 | (EP) . |
| 2 238 193 A | 5/1991 | (GB) . |
| 60174505 | 9/1985 | (JP) . |
| 5-191153 | 7/1993 | (JP) . |
| 06216769 | 5/1994 | (JP) . |
| 07-56504 A | 12/1995 | (JP) . |
| 08130416 | 5/1996 | (JP) . |
| WO 98/35544 | 8/1998 | (WO) . |

* cited by examiner

Primary Examiner—Edward F. Urban
(74) Attorney, Agent, or Firm—Brinks Hofer Gilson & Lione

(57) ABSTRACT

A disturbance may be prevented from being caused in a satellite broadcasting signal of a reception target by a satellite broadcasting signal in which a frequency is higher by 1 octave. This satellite broadcasting receiving tuner includes first and second tuners to which satellite broadcasting signals of a plurality of channels arranged within a frequency band higher than 1 octave are inputted, a local oscillator which oscillates at the same frequency as the frequency of a desired reception satellite broadcasting signal and a higher harmonic wave attenuating device for passing a fundamental wave of a local oscillation signal from the local oscillator and which attenuated a higher harmonic wave, wherein the local oscillation signal is inputted through the higher harmonic wave attenuating device to the first and second demodulators, a phase of the local oscillation signal inputted to the first demodulator and a phase of the local oscillation signal inputted to the second demodulator are shifted from each other by 90 degrees, and baseband signals are respectively outputted from the first and second demodulators.

3 Claims, 1 Drawing Sheet

SATELLITE BROADCASTING RECEIVING TUNER WHICH INHIBITS INTERFERENCE CAUSED BY SATELLITE BROADCAST SIGNALS HAVING ONE OCTAVE HIGHER FREQUENCY BAND

BACKGROUND OF THE INVENTION

1. Field of the Invention

The present invention relates to a satellite broadcasting receiving tuner for receiving a digital system satellite broadcasting.

2. Description of the Related Art

A conventional satellite broadcasting receiving tuner will be described with reference to FIG. 2. Initially, a digital system satellite broadcasting signal (hereinafter simply referred to as a satellite broadcasting signal) is transmitted from a satellite in the frequency band ranging 11 to 12 GHz, frequency-converted by an outdoor down-converter, not shown, into a band ranging from about 950 MHz to 2150 MHz, and then inputted to an input terminal 21 of a satellite broadcasting receiving tuner.

The satellite broadcasting signal inputted to the input terminal 21 is sequentially passed through a bandpass filter 22, a low-noise amplifier 23, a variable attenuator 24 and an amplifier 25 and inputted to a first demodulator 26 and a second demodulator 27. The bandpass filter 22 comprises a so-called variable bandpass filter and has a frequency band (about 27 and several MHz to 36 MHz) of a satellite broadcasting signal of one channel wherein a center frequency thereof is changed in response to a frequency of a satellite broadcasting signal of a desired reception channel. The variable attenuator 24 is comprised of a pin-diode, not shown, and a current flowing through this pin-diode is changed in response to the level of the received satellite broadcasting signal, thereby resulting in an attenuation amount being controlled.

The first demodulator 26 and the second demodulator 27 constitute a QPSK demodulator. A local oscillation signal (first local oscillation signal Lo1) from a local oscillator 28 is directly inputted to the first demodulator 26. A local oscillation signal (second local oscillation signal Lo2) which results from delaying the local oscillation signal from the local oscillator 28 by $\pi/2$ (90 degrees) with a phase-shifter 29 is inputted to the second demodulator 27. Here, the frequency (local oscillation frequency) of the local oscillation signal is oscillated at the same frequency (specifically, almost center frequency of the band of the satellite broadcasting signal of that channel) as the frequency of the satellite broadcasting signal of the desired reception channel.

Then, the first demodulator 26 generates an I signal serving as a first baseband signal by mixing the inputted satellite broadcasting signal and the first local oscillation signal Lo1. The second demodulator 27 generates a Q signal serving as a second baseband signal by mixing the inputted satellite broadcasting signal and the second local oscillation signal Lo2. Accordingly, this satellite broadcasting receiving tuner directly obtains the baseband signal from the received satellite broadcasting signal, and hence comprises so-called direct conversion tuner.

The I signal outputted from the first demodulator 26 is amplified by a first baseband signal amplifier 30, eliminated in higher harmonic component by a first low-pass filter 31, and then introduced from an output terminal 32 to a circuit of the succeeding stage within a satellite broadcasting receiver, not shown.

Similarly, the Q signal outputted from the second demodulator 27 is amplified by a second baseband signal amplifier 33, eliminated in higher harmonic component by a second low-pass filter 34, and then introduced from an output terminal 35 to a circuit of the succeeding stage within a satellite broadcasting receiver, not shown.

However, in the conventional satellite broadcasting receiving tuner, a plurality of inputted satellite broadcasting signals are arranged in the band of 950 MHz to 2150 MHz. In addition, a difference between the frequency of the satellite broadcasting signal of the channel in which the frequency is lowest and the frequency of the satellite broadcasting signal of the channel in which the frequency is highest is more than 1 octave. Further, since the frequency of the inputted satellite broadcasting signal is as high as in the GHz band, it is difficult to make a transmission characteristic (so-called skirt characteristic) of the bandpass filter 22 steep. Therefore, when the satellite broadcasting signal (e.g. frequency is 1000 MHz) of the channel in which the frequency is lowest is received, the satellite broadcasting signal (e.g. frequency is 2000 Hz) of the channel in which the frequency is doubled is inputted to the first demodulator 26 and the second demodulator 27 under the condition that it holds a certain level.

On the other hand, although the local oscillator 28 is oscillated at the same frequency (e.g. 1000 MHz) as the frequency of the received satellite broadcasting signal, this local oscillation signal contains a twice higher harmonic wave (2000 MHz) in addition to a fundamental wave (1000 MHz). Therefore, although the first demodulator 26 and the second demodulator 27 output baseband signals based on the received satellite broadcasting signal (1000 MHz), in addition, the satellite broadcasting signal (2000 MHz) whose frequency is higher by 1 octave and the twice higher harmonic wave (2000 MHz) from the local oscillator 28 are mixed so that the baseband signal based on the satellite broadcasting signal in which the frequency is higher by 1 octave is also outputted. As a result, the satellite broadcasting receiver has the problem that a disturbance is caused by the baseband signal based on the satellite broadcasting signal in which the frequency is higher by 1 octave.

SUMMARY OF THE INVENTION

In view of the aforesaid aspect, it is an object of the present invention to provide a satellite broadcasting receiving tuner in which a disturbance by a satellite broadcasting signal of a channel in which a frequency is higher by 1 octave may be prevented from being caused in a satellite broadcasting signal of a desired reception channel.

According to an aspect of the present invention, there is provided a satellite broadcasting receiving tuner which is comprised of first and second demodulators to which satellite broadcasting signals of a plurality of channels arranged within a frequency band higher than 1 octave are inputted, a local oscillator which oscillates at the same frequency of the frequency of a desired reception satellite broadcasting signal of the satellite broadcasting signals and a higher harmonic wave attenuating device for passing a fundamental wave of a local oscillation signal from the local oscillator and attenuating a higher harmonic wave, wherein the local oscillation signal is inputted through the higher harmonic wave attenuating device to the first and second demodulators, a phase of a local oscillation signal inputted to the first demodulator and a phase of a local oscillation signal inputted to the second demodulator are shifted from each other by 90 degrees, and the first and second demodulators output baseband signals, respectively.

Further, in the satellite broadcasting receiving tuner according to the present invention, the higher harmonic wave attenuating device is a bandpass filter whose passband frequency is changed in response to the change in the frequency of the local oscillation signal.

Furthermore, in the satellite broadcasting receiving tuner according to the present invention, the higher harmonic wave attenuating device is a low-pass filter whose cutoff frequency is changed in response to the change in the frequency of the local oscillation signal.

DESCRIPTION OF THE PREFERRED EMBODIMENT

Figure 1:
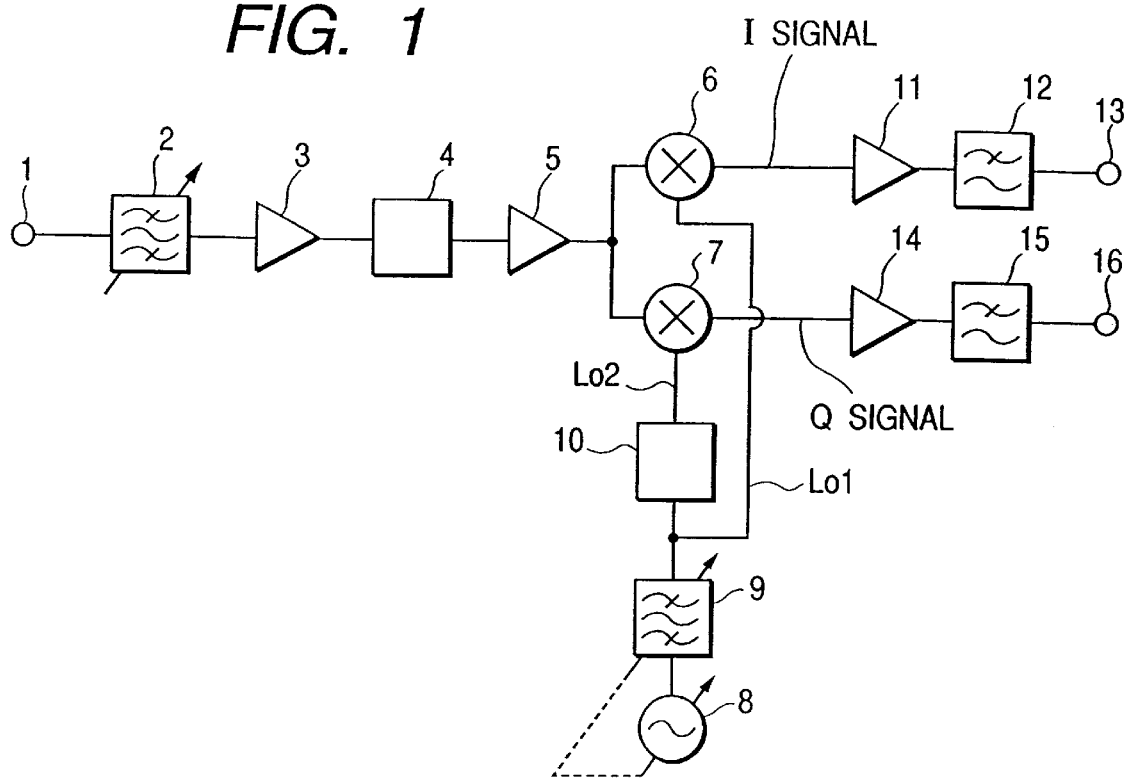
FIG. 1 is a block diagram showing a satellite broadcasting receiving tuner according to the present invention.
Figure 2:
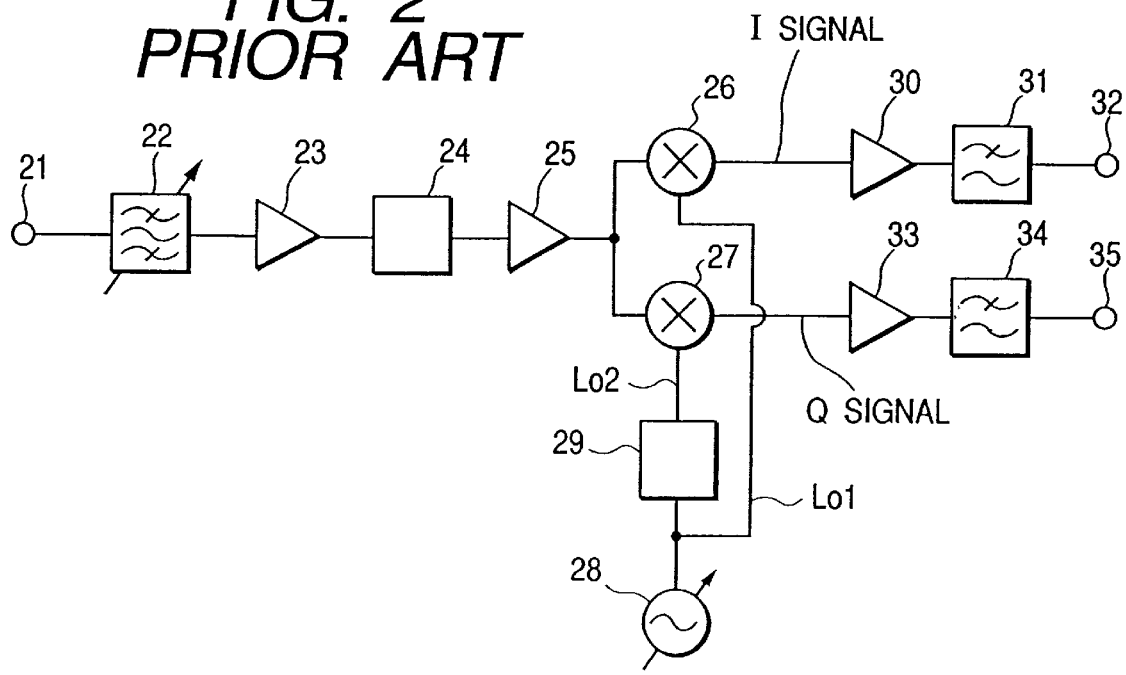
FIG. 2 is a block diagram showing a conventional satellite broadcasting receiving tuner.

A satellite broadcasting receiving tuner according to the present invention will be described below with reference to FIG. 1. Initially, a digital system satellite broadcasting signal (hereinafter simply referred to as a satellite broadcasting signal) is transmitted from a satellite in the frequency band ranging from 11 to 12 GHz, frequency-converted by an outdoor down-converter, not shown, into a band ranging from about 950 MHz to 2150 MHz, and then inputted to an input terminal 1 of a satellite broadcasting receiving tuner.

The satellite broadcasting signal inputted to the input terminal 1 is sequentially passed through a bandpass filter 2, a low-noise amplifier 3, a variable attenuator 4 and an amplifier 5 and inputted to a first demodulator 6 and a second demodulator 7. The bandpass filter 2 comprises a so-called variable bandpass filter and has a passband of a frequency band (approximately 27 and several MHz to 36 MHz) of a satellite broadcasting signal of one channel, and a center frequency thereof is changed in response to a frequency of a satellite broadcasting signal of a desired reception channel. The variable attenuator 4 is composed of a pin-diode, not shown, and a current flowing through this pin-diode is changed by the level of the received satellite broadcasting signal, whereby the attenuation amount is controlled.

The first and second demodulators 6 and 7 comprise a QPSK demodulator, and a local oscillation signal from the local oscillator 8 is inputted to the first and second demodulators 6 and 7. The local oscillator 8 includes a varactor diode (not shown) which changes an oscillation frequency by a tuning voltage, and oscillates at the same frequency as the frequency of the satellite broadcasting signal of a desired reception channel. Here, between the first and second demodulators 6, 7 and the local oscillator 8, there is provided a higher harmonic wave attenuating device 9 for passing the fundamental wave of the local oscillation signal from the local oscillator 8 and which attenuates its higher harmonic wave. Then, the local oscillation signal from the local oscillator 8 is converted by the higher harmonic wave attenuating device 9 into a first local oscillation signal (Lo1) and then inputted to the first demodulator 6. Also, the local oscillation signal is converted by the higher harmonic wave attenuating device 9 and a phase-shifter 10 into a second local oscillation signal (Lo2) and then inputted to the second demodulator 7. This phase-shifter 10 shifts the phase of the second local oscillation signal (Lo2) inputted to the second demodulator 7 from that of the first local oscillation signal inputted to the first demodulator 6 by 90 degrees.

Then, the first demodulator 6 generates an I signal serving as a first baseband signal by mixing the inputted satellite broadcasting signal and the first local oscillation signal (Lo1), and the second demodulator 7 generates a Q signal serving as a second baseband signal by mixing the inputted satellite broadcasting signal and the second local oscillation signal (Lo2). Accordingly, this satellite broadcasting receiving tuner directly obtains the baseband signals from the received satellite broadcast signals, it comprises a so-called direct conversion tuner.

The I signal outputted from the first demodulator 6 is amplified by a first baseband signal amplifier 11, higher harmonic wave component is eliminated by a first low-pass filter 12. Then, the I signal is introduced from an output terminal 13 to a circuit of the succeeding stage within a satellite broadcasting receiver, not shown.

In a like manner, the Q signal outputted from the second demodulator 7 is amplified by a second baseband signal amplifier 14, higher harmonic wave component is eliminated by a second low-pass filter 15. Then, the Q signal is introduced from an output terminal 16 to a circuit of the succeeding stage within the satellite broadcasting receiver, not shown.

Incidentally, as the higher harmonic wave attenuating device 9 provided among the first and second demodulators 6, 7 and the local oscillator 8, there may be used a bandpass filter, a low-pass filter or the like. Then, when the bandpass filter is used, such bandpass filter might be a bandpass filter of a so-called variable passband in which a frequency of a passband, i.e. center frequency of a pass band is changed in response to the change of the local oscillation frequency under the same condition of the frequency of the satellite broadcasting signal of the desired reception channel, namely, the local oscillation frequency of the local oscillator 8. To this end, the bandpass filter includes a varactor diode (not shown) such that a tuning voltage supplied to the local oscillator 8 may be supplied also to the varactor diode of this bandpass filter.

Also, when the higher harmonic wave attenuating device 9 is comprised of a low-pass filter, its cutoff frequency may be set to be higher than a local oscillation frequency and may be changed in response to the change in the local oscillation frequency. Then, the low-pass filter may include a varactor diode (not shown), and a tuning voltage that is supplied to the local oscillator 8 may be supplied to the varactor diode of this low-pass filter.

If the higher harmonic wave attenuating device 9 is provided as described above, when a satellite broadcasting signal (e.g. frequency is 1000 MHz) of a channel in which a frequency is lowest is received, even though a satellite broadcasting signal (e.g. frequency is 2000 MHz) of a channel in which a frequency becomes twice (higher by 1 octave) is inputted to the first and second demodulators 6 and 7 under the condition that it holds a certain level, a twice higher harmonic wave (2000 MHz) is not inputted to the first local oscillation signal (Lo1) inputted to the first demodulator 6 and the second local oscillation signal (Lo2) inputted to the second demodulator 7. Even if the twice harmonic wave is inputted, the level thereof is extremely low so that the satellite broadcasting signal of the channel higher by 1 octave is not demodulated. Accordingly, the first and second demodulators 6 and 7 do not output baseband signals based on the satellite broadcasting signal of the channel higher by 1 octave.

As described above, since the satellite broadcasting receiving tuner according to the present invention includes the first and second demodulators to which satellite broadcasting signals of a plurality of channels arranged within the frequency band higher than 1 octave are inputted, the local oscillator which oscillates at the same frequency as the frequency of a desired reception satellite broadcasting signal in the satellite broadcasting signals, and provided with the higher harmonic wave attenuating device for passing the fundamental wave of the local oscillation signal from the local oscillator and attenuating the higher harmonic wave, wherein the local oscillation signal is inputted through the higher harmonic wave attenuating device to the first and second demodulators, the phase of the local oscillation signal inputted to the first demodulator and the phase of the local oscillation signal inputted to the second demodulator are shifted from each other by 90 degrees and the baseband signals are respectively outputted from the first and second demodulators. By doing so, when a satellite broadcasting signal (e.g. frequency is 1000 MHz) of a channel in which a frequency is lowest is received, even though a satellite broadcasting signal (e.g. frequency is 2000 MHz) of a channel in which a frequency becomes twice (higher by 1 octave) is inputted to the first and second demodulators under the condition that it holds a certain level, a twice higher harmonic wave (2000 MHz) is not inputted. Even if the twice harmonic wave is inputted, the level thereof is extremely low so that the satellite broadcasting signal of the channel higher by 1 octave is not demodulated. Accordingly, the first and second demodulators do not output baseband signals based on the satellite broadcasting signal of the channel higher by 1 octave.

Further, in the satellite broadcasting receiving tuner according to the present invention, since the higher harmonic wave attenuating device is comprised of the bandpass filter whose passband frequency is changed in response to the change in the frequency of the local oscillation signal, it is sufficient to change the frequency of the local oscillation signal from the local oscillator.

Furthermore, in the satellite broadcasting receiving tuner according to the present invention, since the higher harmonic wave attenuating device is comprised of the low-pass filter whose cutoff frequency is changed in response to the change in the frequency of the local oscillation signal, it is sufficient to change the frequency of the local oscillation signal from the local oscillator, similarly.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A satellite broadcasting receiving tuner comprising:

first and second demodulators to which satellite broadcasting signals of a plurality of channels arranged within a frequency band higher than 1 octave are inputted; and a local oscillator which oscillates at the same frequency of the frequency of a desired reception satellite broadcasting signal in said satellite broadcasting signals;

wherein a phase of a local oscillation signal inputted from said local oscillator to said first demodulator and a phase of a local oscillation signal inputted from said local oscillator to said second demodulator are made different from each other by 90 degrees, and said first and second demodulators output baseband signals, respectively;

said first demodulator comprising a fundamental wave mixer for generating a mixed wave of a fundamental wave of the local oscillation signal from said local oscillator and said satellite broadcasting signal;

said second demodulator comprising a fundamental wave mixer for generating a mixed wave of the fundamental wave of the local oscillation signal from said local oscillator and said satellite broadcasting signal;

a higher harmonic wave attenuator for passing the fundamental wave of the local oscillation signal from said local oscillator therethrough and for attenuating higher harmonic waves is disposed between said local oscillator and said first and second demodulator; and a local oscillation signal having the same frequency of the frequency of the desired reception satellite broadcasting signal is inputted into said first and second demodulators via said higher harmonic wave attenuator.

2. A satellite broadcasting receiving tuner according to claim 1, wherein said higher harmonic wave attenuator comprises a bandpass filter whose passband frequency is changed in response to the change in the frequency of said local oscillation signal, and the center frequency of the passband of said bandpass filter when the satellite broadcasting signal of a channel having the highest frequency is received is set twice or greater as high as the center frequency of the passband of said bandpass filter when the satellite broadcasting signal of a channel having the lowest frequency is received.

3. A satellite broadcasting receiving tuner according to claim 1, wherein said higher harmonic wave attenuator comprises a low-pass filter whose cutoff frequency is changed in response to the change in the frequency of said local oscillation signal, and the cutoff frequency of the passband of said bandpass filter when the satellite broadcasting signal of a channel having the highest frequency is received is set twice or greater as high as the cutoff frequency of the passband of said bandpass filter when the satellite broadcasting signal of a channel having the lowest frequency is received.

* * * * *